United States Patent [19]

Anderson

[11] 4,168,539
[45] Sep. 18, 1979

[54] MEMORY SYSTEM WITH ROW CLAMPING ARRANGEMENT

[75] Inventor: Bruce C. Anderson, Tewksbury, Mass.

[73] Assignee: GTE Laboratories Incorporated, Stamford, Conn.

[21] Appl. No.: 942,525

[22] Filed: Sep. 15, 1978

[51] Int. Cl.² .................. G11C 7/00; G11C 11/40
[52] U.S. Cl. .................................. 365/190; 365/155; 307/DIG. 3
[58] Field of Search ............... 365/154, 155, 202, 226, 365/190; 307/238, DIG. 3, DIG. 5

[56] References Cited

U.S. PATENT DOCUMENTS 4,099,070  7/1978  Reinert .............................. 365/155

OTHER PUBLICATIONS

Blount et al., DI-Istor Speed-Up Word Drive With Resistor Word Bottom, IBM Tech. Disc. Bul., vol. 14, No. 6, 11/71, pp. 1734-1735.

*Primary Examiner*—Stuart N. Hecker
*Attorney, Agent, or Firm*—David M. Keay

[57] ABSTRACT

A memory system of an array of memory elements arranged in an electrical matrix of rows and columns. Each memory element comprises a bistable circuit of two bipolar transistors. Holding current flows through the on transistor of each memory element of a row from a common current source to a common line. When a memory element is switched so that is transistors reverse operating conditions, the holding current flow through the memory element is diverted during the transition. A clamping arrangement of a transistor and associated resistance is connected between the common current source and the common line of each row. When all of the memory elements of a row are switched at the same time the clamping arrangement provides an alternative controlled current path for the diverted holding currents.

4 Claims, 1 Drawing Figure

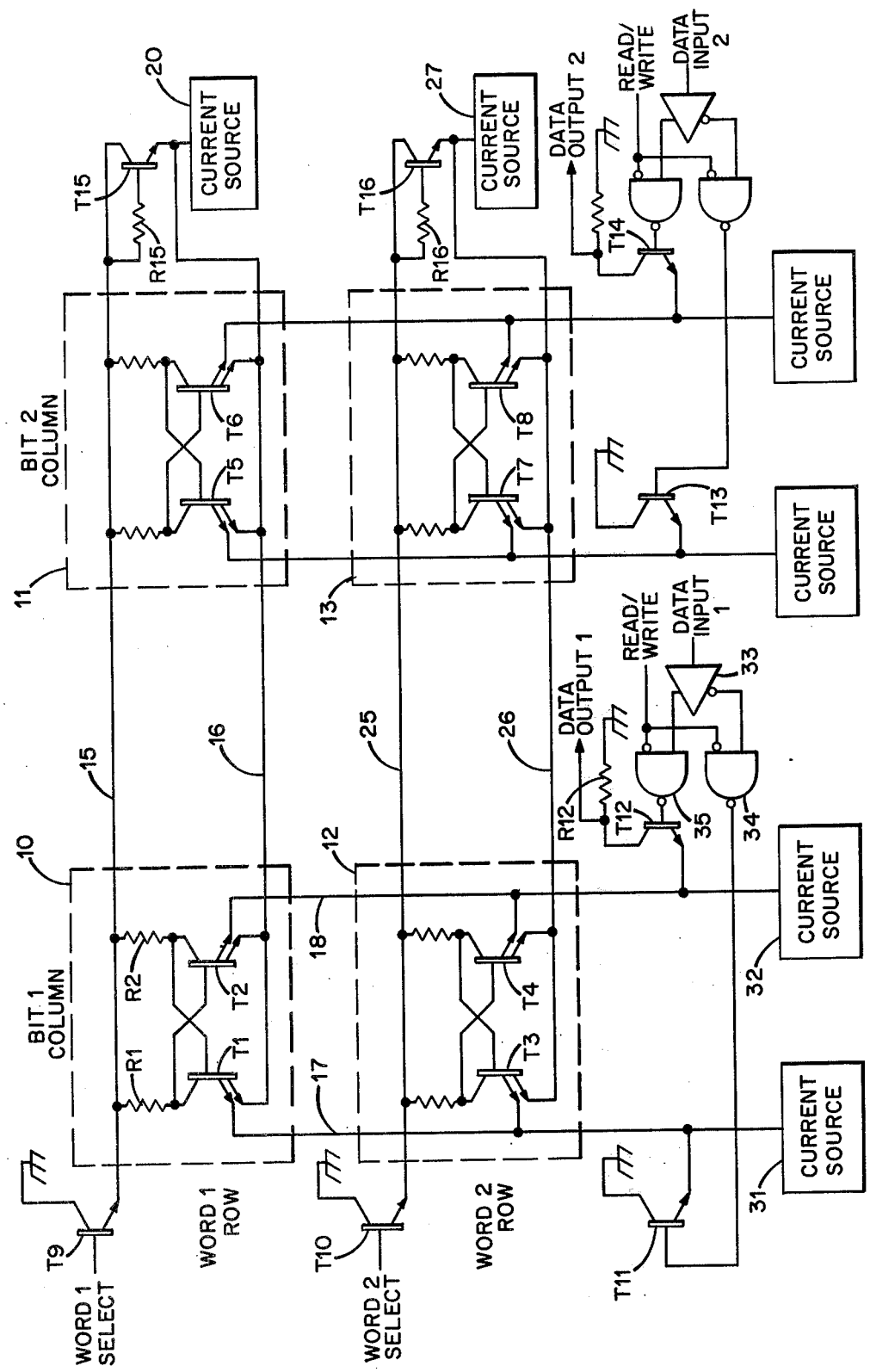

MEMORY SYSTEM WITH ROW CLAMPING ARRANGEMENT

BACKGROUND OF THE INVENTION

This invention relates to memory systems. More particularly, it is concerned with random access memory (RAM) systems employing bipolar transistors.

Random access memory systems employing an array of memory elements arranged in an electrical matrix of rows and columns are well-known. One type of system employing memory elements which utilize two bipolar transistors in a bistable circuit is described in an article entitled "A 25-ns Read Access Bipolar 1Kbit TTL RAM" by Mayumi et al in the IEEE Journal of Solid-State Circuits, October 1974. Circuits of the type described are widely used in integrated circuit memory systems. Each of the memory elements has two stable operating states, in each state one of the transistors is on and the other is off. Each row of memory elements is designated as storing a word and is either in a selected condition to permit the reading out or writing in of data or remains in a standby condition. The voltage level on a word select line connected to the memory elements of a row either selects the row to be in the read-write mode or causes the row to be in the standby mode. Each column of memory elements stores a bit of each word. Bit lines are connected to each of the memory elements of a column for reading out or writing in data to the memory elements of the column. An individual memory element of the array is selected by selection of the appropriate row and column.

When a memory element is in the standby mode as determined by the voltage level on its associated word select line, current flow through the on transistor does not affect the associated bit lines nor do signals on the bit lines affect the memory element. A memory element is selected, or placed in the read/write mode, by an appropriate voltage level applied to the associated word select line. In order to write data into a memory element by changing its operating state a writing current is passed through the off transistor of the memory element to turn the off transistor on. The wiriting current must be greater than the holding current flowing through the on transistor. Positive feedback causes the transistors to reverse operating states. While the transistors are in the process of changing operating states, voltages within the memory element change tending to reduce the flow of holding current therethrough. Usually the blocked holding current is diverted to flow through any of the memory elements of the row which are not undergoing a change of state. Thus, the switching action takes place rapidly with no interference caused by the blocked holding current.

In many applications employing memory systems of the foregoing type it is desired to write data into all the memory elements of a selected row at the same time. If one or more of the memory elements of the row is not being switched to the opposite state, the blocked holding current from the memory elements being switched passes through those memory elements of the row which are not being switched. If all of the memory elements of the row are being switched to the opposite state simultaneously, however, alternative paths for the blocked holding current are not available. The resulting voltage levels within the memory elements have an adverse effect on their switching speeds thus reducing the rate at which the memory system can be operated reliably.

SUMMARY OF THE INVENTION

Memory systems in accordance with the present invention provide rapid switching of the memory elements being switched. A memory system includes a plurality of memory elements arranged in an electrical matrix of rows and columns with each memory element comprising a bistable circuit having first and second operating states. A word current source means is associated with each row of memory elements, and each word current source means is connected to the memory elements of its associated row. A word select means is associated with each row of memory elements and is connected to the memory elements of its associated row. Each word select means operates to select the associated row of memory elements. Read/write means is associated with each column of memory elements and is connected to the memory elements of the associated column. Each read/write means operates to produce a read condition or a write condition at the memory elements of the associated column, and each read/write means includes data input means for receiving a data input signal at a first or a second level at a data input terminal. An output means is associated with each column of memory elements and is coupled to the read/write means of the associated column. Each output means produces an output signal indicating the operating state of the memory element of its associated column which is located in a row of memory elements being selected by a word select means while a read condition is being produced by the associated read/write means. Each memory element in a row which is being selected by the associated word select means is set to the first or second operating state, depending upon the data input signal being received by the data input means of its associated column, in response to a write condition being produced by the read/write means of its associated column. A clamping means is associated with each row of memory elements. Each clamping means is connected between the associated word select means and the word current source means and provides a controlled current path between the word select means and the word current source means while the operating state of the memory elements of the associated row are being set. The clamping means thus maintains a path for holding current despite the voltage conditons temporarily existing in the memory elements as they change operating states.

BRIEF DESCRIPTION OF THE DRAWINGS

The sole FIGURE in the drawings is a schematic circuit diagram illustrating an exemplary 2×2 matrix of memory elements in a random access memory system in accordance with the present invention.

For a better understanding of the present invention, together with other objects, advantages, and capabilities thereof, reference is made to the following discussion and appended claims in connection with the above-described drawing.

DETAILED DESCRIPTION OF THE INVENTION

The single FIGURE of the drawing illustrates a memory system employing a 2×2 array of memory elements which is amenable to fabrication as an integrated circuit. Although for purposes of the present discussion only four memory elements are shown, as is well understood a larger number of memory elements may be included in the array. The four memory elements 10, 11, 12, and 13 are arranged in two rows and two columns. The memory elements of each row store a word, and the memory elements of each column store a bit of each word.

Each memory element includes a bitstable circuit of two dual emitter bipolar transistors, such as transistors T1 and T2 of the word 1 bit 1 memory element 10. The base of each transistor T1 and T2 is connected to the collector of the other and through equal resistances R1 and R2, respectively, to a word select line 15. Each of the resistances is in shunt with a clamping diode (not illustrated) which prevents the transistors from going into full saturation. The first emitter of each transistor, T1 and T2, is connected to a bias line 16. The second emitter of transistor T1 is connected to a first bit or sensing line 17 and the second emitter of transistor T2 is connected to a second bit or sensing line 18.

The word select line 15 is connected to both of the memory elements 10 and 11 of the word 1 row and to the emitter of a word select transistor T9. The collector of transistor T9 is connected to ground and its base is connected to an input connection for receiving an input signal to select or not select the row as will be explained hereinbelow. The bias line 16 is connected to the first emitters of both of the transistors of both of the memory elements 10 and 11 of the row and to a current source 20.

A clamping arrangement of a transistor T15 and a resistance R15 is connected between the word select line 15 and the bias line 16 in parallel with the memory elements 10 and 11. The collector of transistor T15 is connected to the word select line 15, its emitter is connected to the bias line 16, and its base is connected through the resistance R15 to the word select line 15. The value of resistance R15 is the same as that of the resistances R1 and R2 in the memory elements, and transistor T15 has the same electrical characteristics as provided by the collector, base, and first emitter of each dual emitter transistor of the memory elements.

The memory elements 12 and 13 of the word 2 row are connected in a similar manner to a word select line 25 and word select transistor T10 and to a bias line 26 and current source 27. A clamping arrangement of a transistor T16 and a resistance R16 is connected between the word select line 25 and the bias line 26.

The bit lines are connected to all of the memory elements of a column. In the bit 1 column as illustrated, the second emitters of the first transistors T1 and T3 of the two memory elements 10 and 12 in the column are both connected to the first bit line 17, and second emitters of the second transistors T2 and T4 of the memory elements 10 and 12 are both connected to the second bit line 18. The bit line 17 is connected to a first current source 31 and the second bit line 18 is connected to a second current source 32. The first bit line 17 is also connected to the emitter of a switching or control transistor T11 which has its collector connected to ground. The second bit line 18 is connected to the emitter of a switching or control transistor T12 which has its collector connected through a resistance R12 to ground. The collector of transistor T12 is also connected to a data output 1 connection so as to provide bit 1 outpiut data during a READ signal as will be explained hereinbelow. A data input 1 connection is connected to a gate 33 having an output and an inverted output to gates 35 and 34, respectively. A read/write connection is connected to the other inputs of the gates 34 and 35. The outputs from the gates 34 and 35 are applied to the bases of control transistors T11 and T12, respectively.

Similar elements and connections are provided for each column of memory elements as illustrated in the FIGURE. The read/write connections which are shown separately for each column may be connected in common.

The basic arrangement of memory elements as shown and described and their manner of operation as explained hereinbelow are generally well-known. Data is stored in each memory element by virtue of being set in one or the other of two possible operating states with one of the two transistors on and the other off. Under operating conditions one row of memory elements is always being selected and the other is in the standby mode. During the standby mode a memory element remains in the operating state to which it is set and the data can neither be read out nor changed. A row of memory elements is maintained in the standby mode by a relatively low voltage level at the input to the word select transistor T9 or T10 for the row. The resulting low voltage level on the word select line 15 or 25 produces voltages in the memory elements such that the presence of read and write signal conditions on the bit lines has no effect on the memory elements and the memory elements have no effect on the signal conditions on the bit lines.

In order to read out and/or write in data a row of memory elements is selected by a relatively high voltage level to the input of the word select transistor T9 or T10 which raises the voltage level on the associated word select line 15 or 25. Either a READ or a WRITE signal is always present at the read/write input of each column so that data is either being read out of or written into each memory element of a row for as long as the row is selected. For example, when the input to the word 1 select transistor T9 is raised, the voltage on the word select line 15 is raised. Assuming that transistor T1 of memory element 10 is off and transistor T2 is on, holding current flows between the current source 20 and the word select line 15 by way of the first emitter of transistor T2. During a READ signal (a logic 1 level) at the read/write input, control transistor T11 is on and current from the current source 31 flows therethrough to ground. Control transistor T12 is off and current from the current source 32 flows through transistor T2 by way of its second emitter. The voltage level at the data output 1 connection indicates the operating state of the memory element 10.

Data as determined by the voltage level at the data input 1 connection is written into the memory element 10 during a WRITE signal (a logic 0 level) at the read/write input. Assuming the presence of a logic 0 level at the data input 1 connection while the memory element 10 is in the operating state as described above, control transistor T11 is turned off causing the current from the current source 31 to flow through the off transistor T1 by way of its second emitter turning that transistor on. This current is greater than the holding current flowing through transistor T2, and by virtue of the positive feedback between transistors T1 and T2 transistor T2 is switched on. Both the current from the current source 31 and the holding current from the current source 20 flow through the on transistor T1. With transistor T2 off, current flow from the current source 32 flows through control transistor T12 to ground.

As stated hereinabove the current flowing through the initially on transistor T2 from the current source 32 is greater than the holding current flowing through the on transistor T2 from the current source 20. When the control transistor T11 is turned off and current from the current source 31 flows through the initially off transistor T1, positive feedback action takes places to reverse the operating states of the two transistors T1 and T2. This action causes the voltage at the base of transistor T1 to increase (becomes less negative) and that at the base of transistor T2 to decrease (becomes more negative). During the transition in operating states the holding current tends to be diverted from the memory element. As long as at least one of the memory elements in the row is not being switched, some holding current from memory elements being switched is diverted to those not being switched. If all of the memory elements of a row are being switched to different operating states at the same time, however, they provide no alternative path for the holding currents. Under these conditions the holding currents through the memory elements tend to remain high and the voltage level on the bias line 16 tends to drop. Since the switching action cannot go to completion until current flow through resistance R1 exceeds that through resistance R2, if the holding current through resistance R2 remains high, a longer time is required to complete the switching action and restore the circuitry to a stable operating level.

In the system in accordance with the present invention, however, the clamping arrangement of transistor T15 and resistance R15 acts as a memory element which is not being switched. Thus, an alternative path for holding currents is provided between the word select line 15 and bias line 16 maintaining the voltage drop therebetween substantially constant when all of the memory elements of the row are being switched simultaneously. The switching action during the writing in of data thus takes place at a normal rapid rate with no interference due to the holding currents. Although only a single clamping arrangement is shown for a row of two memory elements, additional clamping arrangements in parallel may be employed for a greater number of memory elements requiring the handling of larger amounts of diverted holding current.

Thus, while there has been shown and described what is considered a preferred embodiment of the present invention, it will be obvious to those skilled in the art that various changes and modifications may be made therein without departing from the invention as defined by the appended claims.

What is claimed is:

1. A memory system including
   a plurality of memory elements arranged in an electrical matrix of rows and columns, each memory element comprising a bistable circuit having first and second operating states;
   word current source means associated with each row of memory elements, each word current source means being connected to the memory elements of the associated row;
   word select means associated with each row of memory elements, each word select means being connected to the memory elements of the associated row and being operable to select the associated row of memory elements;
   read/write means associated with each column of memory elements, each read/write means being connected to the memory elements of the associated column and being operable to produce a read condition or a write condition at the memory elements of its associated column;
   each read/write means including data input means for receiving a data input signal at a first or a second level at a data input terminal thereof;
   output means associated with each column of memory elements, each output means being coupled to the read/write means of the associated column and being operable to produce an output signal indicating the operating state of the memory element of its associated column located in a row of memory elements being selected by a word select means in response to a read condition being produced by the associated read/write means;
   each memory element in a row which is being selected by the associated word select means being operable to be set to the first or second operating state depending upon the data input signal being received by the data input means of its associated column in response to a write condition being produced by the read/write means of its associated column; and
   clamping means associated with each row of memory elements, each clamping means being connected between the associated word select means and word current source means for providing a controlled current path between the word select means and the word current source means while the operating states of the memory elements of the associated row are being set.

2. A memory system in accordance with claim 1 wherein
   each of said word select means includes a word select line connected to all of the memory elements of the associated row of memory elements and a word select input means for establishing a first voltage level on the word select line to select the row and for establishing a second voltage level on the word select line when the row is not being selected;
   each of said word current source means includes a bias line connected to all of the memory elements of the associated row of memory elements;
   each of said memory elements includes a pair of cross-coupled transistors connected between the word select line and bias line of its associated row; and
   each of said clamping means includes a transistor circuit connected between the word select line and bias line of its associated row and operable to maintain the voltage level on the bias line substantially constant while the operating states of the memory elements of the associated row are being set.

3. A memory system in accordance with claim 2 wherein
   each of said memory elements includes a pair of cross-coupled dual emitter transistors each having their collectors coupled to the word select line of the associated row and their first emitters connected to the bias line of the associated row, each memory element being in the first operating state when one transistor is on and the other transistor is off and being in the second operating state when the one transistor is off and the other transistor is on;
   each of said read/write means includes first current source means connected to the second emitter of the one transistor of each memory element of the associated column, second current source means connected to the second emitter of the other transistor of each memory element of the associated column, a read/write input connection, first control means connected to the second emitters of the one transistors of all of the memory elements of the associated column and coupled to the associated first current source means, data input means, and read/write input connection, and second control means connected to the second emitters of the other transistors of all the memory elements of the associated column and coupled to the associated second current source means, data input means, and read/write input connection, the control means connected to the on transistor of a memory element which is connected to a word select line at said first voltage level causing current from the current source means connected thereto to flow through the on transistor when a read signal is present at the read/write input connection, and the control means connected to the off transistor of a memory element which is connected to a word select line at said first voltage level causing current from the current source means connected thereto to flow through the control means and not through the off transistor when a read signal is present at the read/write input connection, one control means being operable in response to a data input signal at the first level at the data input terminal when a write signal is present at the read/write input connection to cause current from the current source means connected thereto to flow through the transistor connected thereto of a memory element which is connected to a word select line at said first voltage level causing that transistor to be on, and the one control means being operable in response to a data input signal at a second level at the data input terminal when a write signal is present at the read/write input connection to cause current from the current source means connected thereto to flow through the one control means and not through the transistor connected thereto of a memory element which is connected to a word select line at said first voltage level causing that transistor to be off, the other control means being operable in response to said data input signal at the first level at the data input terminal when a write signal is present at the read/write input connection to cause current from the current source means connected thereto to flow through the other control means and not through the transistor connected thereto of a memory element which is connected to a word select line at said first voltage level causing that transistor to be off, and the other control means being operable in response to said data input signal at the second level at the data input terminal when a write signal is present at the read/write input connection to cause current from the current source means connected thereto to flow through the transistor connected thereto of a memory element which is connected to a word select line at said first voltage level causing that transistor to be on;

the transistors of the memory elements having similar electrical characteristics such that current flow from the word current source means connected to the memory elements of a row of memory elements connected to a word select line at the first voltage level flows equally through the on transistors of the memory elements of the row;

said clamping means providing a current path between the word select line at the first voltage level and the word current source means so as to provide a voltage drop similar to that between the word select line at the first voltage level and the word current source means provided through an on transistor; whereby when all of the memory elements of a row are changing operating states simultaneously, the clamping means provides an undisturbed path for current from the word current source means to the word select line maintaining a constant voltage on the bias line.

4. A memory system in accordance with claim 3 wherein the transistors of each memory element have their collectors and bases cross-coupled;

a resistance of predetermined value is connected between the word select line and the collector of the one transistor and the base of the other transistor;

a resistance of said value is connected between the word select line and the collector of the other transistor and the base of the one transistor;

each clamping means includes a transistor having its emitter connected to the bias line, its collector connected to the word select line, and its base connected through a resistance to the word select line; the transistor having substantially the same electrical characteristics as the electrical characteristics provided by the collector, base, and the first emitter of each transistor of the memory element.

* * * * *